us010879773B2

(12) United States Patent
Ambo et al.

(10) Patent No.: US 10,879,773 B2
(45) Date of Patent: Dec. 29, 2020

(54) ON-VEHICLE MOTOR-DRIVEN COMPRESSOR (71) Applicant: KABUSHIKI KAISHA TOYOTA JIDOSHOKKI, Kariya (JP)

(72) Inventors: Shunsuke Ambo, Kariya (JP); Fumihiro Kagawa, Kariya (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 0 days.

(21) Appl. No.: 16/366,009

(22) Filed: Mar. 27, 2019

(65) Prior Publication Data
US 2019/0305647 A1 Oct. 3, 2019

(30) Foreign Application Priority Data

Mar. 30, 2018 (JP) ................................. 2018-070077

(51) Int. Cl.
| H02K 11/02 | (2016.01) |
| H02K 11/33 | (2016.01) |
| H02K 11/30 | (2016.01) |
| H02K 11/27 | (2016.01) |
| H01F 37/00 | (2006.01) |
| B60H 1/32 | (2006.01) |
| H03H 7/01 | (2006.01) |

(52) U.S. Cl.
CPC ........... *H02K 11/02* (2013.01); *B60H 1/3226* (2013.01); *H02K 11/33* (2016.01); *H03H 7/0115* (2013.01)

(58) Field of Classification Search
CPC ........ H02K 11/30; H02K 5/225; H02K 11/27; H02K 3/12; H01F 37/00
USPC ................... 310/75 R, 49.13, 68 D; 336/229
See application file for complete search history.

(56) References Cited

U.S. PATENT DOCUMENTS 5,546,065 A * 8/1996 Vinciarelli ............ H01F 27/346
336/212
2017/0288512 A1* 10/2017 Kagawa ................. H02K 11/33

FOREIGN PATENT DOCUMENTS

JP 2008-098307 A 4/2008

* cited by examiner

*Primary Examiner* — Jose A Gonzalez Quinones
(74) *Attorney, Agent, or Firm* — Sughrue Mion, PLLC (57) ABSTRACT A common-mode choke coil includes a loop-shaped core, a cover made of a conductor covering at least part of the core, a first winding wound around an outer surface of the cover, and a second winding wound around the outer surface of the cover. The cover includes a first region around which the first winding is wound, a second region around which the second winding is wound, and two connection regions that connect the first region and the second region to each other in a circumferential direction. The cover has first and second slits in an inner circumferential surface. The first slit extends such that the first region is non-continuous with respect to a winding direction of the first winding. The second slit extends such that the second region is non-continuous with respect to a winding direction of the second winding.

4 Claims, 11 Drawing Sheets

ON-VEHICLE MOTOR-DRIVEN COMPRESSOR

BACKGROUND

The present disclosure relates to an on-vehicle motor-driven compressor.

Japanese Laid-Open Patent Publication No. 2008-98307 discloses one example of an inductance element. Such an inductance element includes a core, a conductor that covers the surface of the core, a dielectric that covers the conductor, and coils configured by directly winding coated wires around the dielectric.

Some on-vehicle motor-driven compressors include an inverter device that drives an electric motor that drives a compression unit and includes an inverter circuit and a low-pass filter circuit. There is a demand for the on-vehicle motor-driven compressor to have a damping effect.

SUMMARY

It is an object of the present disclosure to provide an on-vehicle motor-driven compressor including a filter circuit excellent in the damping effect.

An on-vehicle motor-driven compressor according to one aspect includes a compression unit configured to compress fluid, an electric motor configured to drive the compression unit, and an inverter device configured to drive the electric motor. The inverter device includes an inverter circuit configured to convert direct-current power into alternating-current power and a noise reducer arranged on an input side of the inverter circuit. The noise reducer is configured to reduce common-mode noise and normal-mode noise contained in the direct-current power before being input to the inverter circuit. The noise reducer includes a common-mode choke coil and a smoothing capacitor. The common-mode choke coil and the smoothing capacitor configure a low-pass filter circuit. The common-mode choke coil includes a loop-shaped core, a cover made of a conductor circumferentially covering at least part of the core, the cover having a shape of a loop or an incomplete loop, a first winding wound around an outer surface of the cover, and a second winding wound around the outer surface of the cover. The cover includes a first region around which the first winding is wound, a second region around which the second winding is wound, and two connection regions that connect the first region and the second region to each other in a circumferential direction of the cover. The two connection regions are arranged side by side in an axial direction of the cover. The cover has a first slit in an inner circumferential surface, the first slit extending in the circumferential direction of the cover such that the first region is non-continuous with respect to a winding direction of the first winding. The cover has a second slit in the inner circumferential surface, the second slit extending in the circumferential direction of the cover such that the second region is non-continuous with respect to a winding direction of the second winding.

Other aspects and advantages of the present disclosure will become apparent from the following description, taken in conjunction with the accompanying drawings, illustrating by way of example the principles of the disclosure.

BRIEF DESCRIPTION OF THE DRAWINGS

The disclosure may be understood by reference to the following description together with the accompanying drawings in which.

DETAILED DESCRIPTION

An embodiment will now be described with reference to the drawings. An on-vehicle motor-driven compressor 11 of the first embodiment includes a compression unit 18 that compresses refrigerant serving as fluid and is used with, for example, an on-vehicle vehicle air conditioner. That is, the fluid to be compressed in the on-vehicle motor-driven compressor in the first embodiment is refrigerant.

Figure 1:
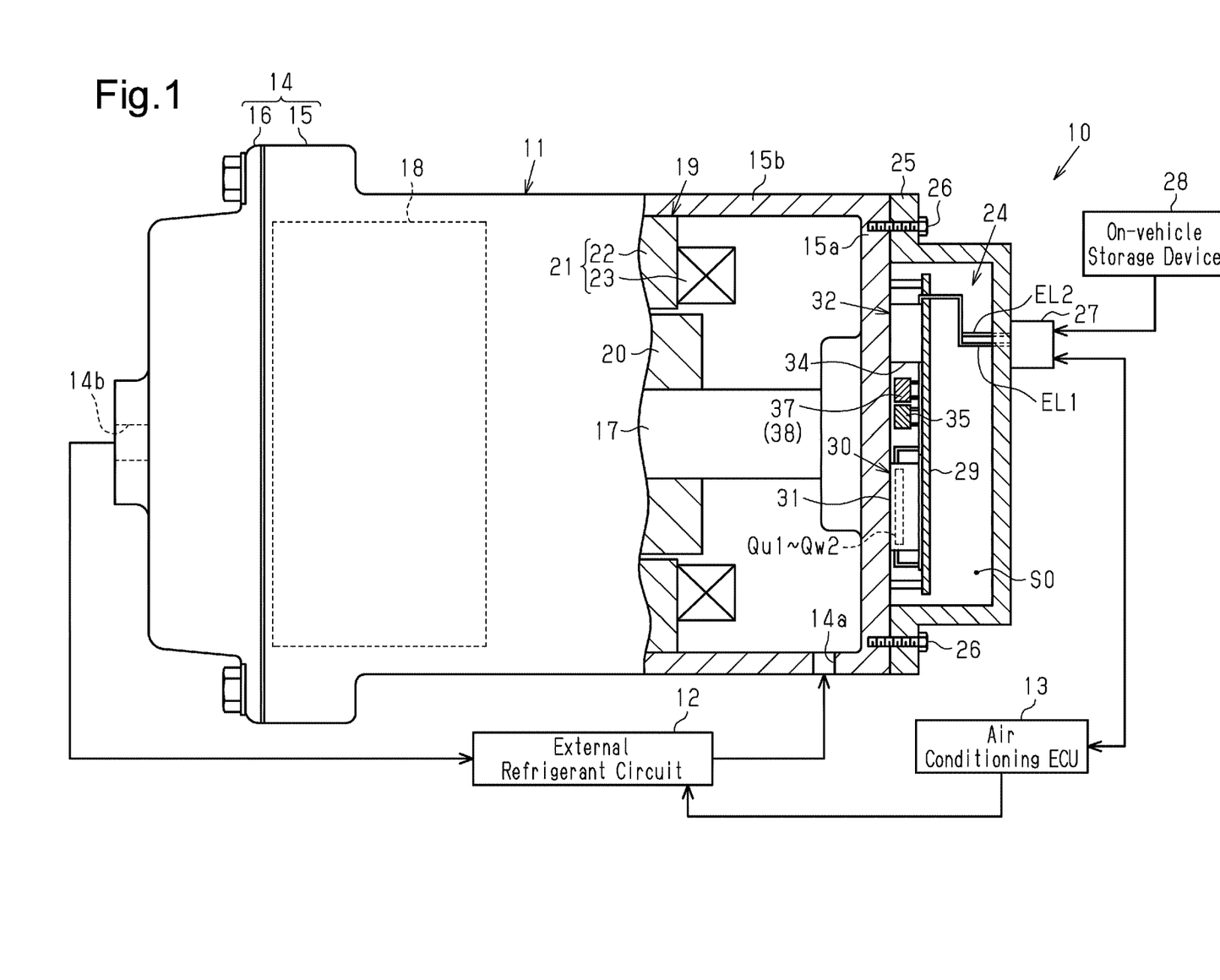
FIG. 1 is a schematic view showing an on-vehicle motor-driven compressor.

As shown in FIG. 1, an on-vehicle air conditioner 10 includes the on-vehicle motor-driven compressor 11 and an external refrigerant circuit 12 that supplies the on-vehicle motor-driven compressor 11 with refrigerant serving as fluid. The external refrigerant circuit 12 includes, for example, a heat exchanger and an expansion valve. The on-vehicle motor-driven compressor 11 compresses refrigerant and the external refrigerant circuit 12 performs heat exchange of the refrigerant and expands the refrigerant. This allows the on-vehicle air conditioner 10 to cool and warm the passenger compartment.

The on-vehicle air conditioner 10 includes an air conditioning ECU 13 that controls the entire on-vehicle air conditioner 10. The air conditioning ECU 13 is configured to obtain, for example, the temperature of the passenger compartment and the preset temperature of the car air conditioner. Based on the parameters, the air conditioning ECU 13 transmits various commands such as an on-off command to the on-vehicle motor-driven compressor 11.

The on-vehicle motor-driven compressor 11 includes a housing 14 having an intake port 14a into which refrigerant is drawn in from the external refrigerant circuit 12.

The housing 14 is made of a thermally conductive material (for example, metal such as aluminum). The housing 14 is grounded to the vehicle body.

The housing 14 includes an intake housing member 15 and a discharge housing member 16 that are coupled to each other. The intake housing member 15 has a tubular shape with one end closed and the other end open. The intake housing member 15 includes a plate-shaped bottom wall 15a and a side wall 15b that extends from the edge of the bottom wall 15a toward the discharge housing member 16. The bottom wall 15a is, for example, substantially plate-shaped, and the side wall 15b is, for example, substantially tubular. The discharge housing member 16 is coupled to the intake housing member 15 to close the opening of the intake housing member 15. This defines an internal space in the housing 14.

The intake port 14a extends through the side wall 15b of the intake housing member 15. More specifically, the intake port 14a is located at a position in the side wall 15b of the intake housing member 15 closer to the bottom wall 15a than to the discharge housing member 16.

The housing 14 has a discharge port 14b out of which refrigerant is discharged. The discharge port 14b is located at the discharge housing member 16, more specifically, at a part of the discharge housing member 16 opposed to the bottom wall 15a.

The on-vehicle motor-driven compressor 11 includes a rotating shaft 17, the compression unit 18, and an electric motor 19 that are accommodated in the housing 14.

The rotating shaft 17 is rotationally supported by the housing 14. The rotating shaft 17 is arranged with its axial direction coinciding with the thickness direction of the plate-shaped bottom wall 15a (i.e., the axial direction of the tubular side wall 15b). The rotating shaft 17 and the compression unit 18 are coupled to each other.

The compression unit 18 is located in the housing 14 at a position closer to the discharge port 14b than to the intake port 14a (i.e., the bottom wall 15a). Rotation of the rotating shaft 17 causes the compression unit 18 to compress refrigerant that has been drawn into the housing 14 from the intake port 14a and then discharge the compressed refrigerant out of the discharge port 14b. The specific structure of the compression unit 18 may be of any type such as a scroll type, a piston type, or a vane type.

The electric motor 19 is located in the housing 14 between the compression unit 18 and the bottom wall 15a. The electric motor 19 is configured to drive the compression unit 18 by rotating the rotating shaft 17, which is located in the housing 14. The electric motor 19 includes, for example, a cylindrical rotor 20 fixed to the rotating shaft 17 and a stator 21 fixed to the housing 14. The stator 21 includes a cylindrical stator core 22 and coils 23 wound around the teeth of the stator core 22. The rotor 20 and the stator 21 face each other in the radial direction of the rotating shaft 17. When the coils 23 are energized, the rotor 20 and the rotating shaft 17 rotate. This causes the compression unit 18 to compress refrigerant.

As shown in FIG. 1, the on-vehicle motor-driven compressor 11 includes a driver device 24 configured to drive the electric motor 19 and receive direct-current power and a cover 25 that defines an accommodation chamber S0 for accommodating the driver device 24.

The cover 25 is made of a non-magnetic material that is thermally and electrically conductive (for example, metal such as aluminum).

The cover 25 has a tubular shape with one end closed and the other end open toward the housing 14, more specifically, toward the bottom wall 15a of the intake housing member 15. The cover 25 is coupled to the bottom wall 15a of the housing 14 by bolts 26 with the open end in abutment with the bottom wall 15a. The opening of the cover 25 is closed by the bottom wall 15a. The accommodation chamber S0 is defined by the cover 25 and the bottom wall 15a.

The accommodation chamber S0 is located outside the housing 14 and located on the opposite side of the bottom wall 15a from the electric motor 19. The compression unit 18, the electric motor 19, and the driver device 24 are arranged in the axial direction of the rotating shaft 17.

The cover 25 includes a connector 27 to which the driver device 24 is electrically connected. The connector 27 allows the driver device 24 to receive direct-current power from an on-vehicle power storage device 28, which is installed in the vehicle, and electrically connects the air conditioning ECU 13 and the driver device 24 to each other. The on-vehicle power storage device 28 is a direct-current power source installed in the vehicle and is, for example, a rechargeable battery or a capacitor.

As shown in FIG. 1, the driver device 24 includes a circuit board 29, an inverter device 30 provided on the circuit board 29, and two connection lines EL1 and EL2 used to electrically connect the connector 27 and the inverter device 30 to each other.

The circuit board 29 has a plate shape. The circuit board 29 is opposed to the bottom wall 15a and spaced apart from the bottom wall 15a by a predetermined distance in the axial direction of the rotating shaft 17.

The inverter device 30 is configured to drive the electric motor 19. The inverter device 30 includes an inverter circuit 31 (refer to FIG. 2) and a noise reducer 32 (refer to FIG. 2). The inverter circuit 31 is configured to convert direct-current power into alternating-current power. The noise reducer 32 is located on the input side of the inverter circuit 31 and is configured to reduce common-mode noise and normal-mode noise contained in the direct-current power before being input to the inverter circuit 31.

The electrical configuration of the electric motor 19 and the driver device 24 will now be described.

Figure 2:
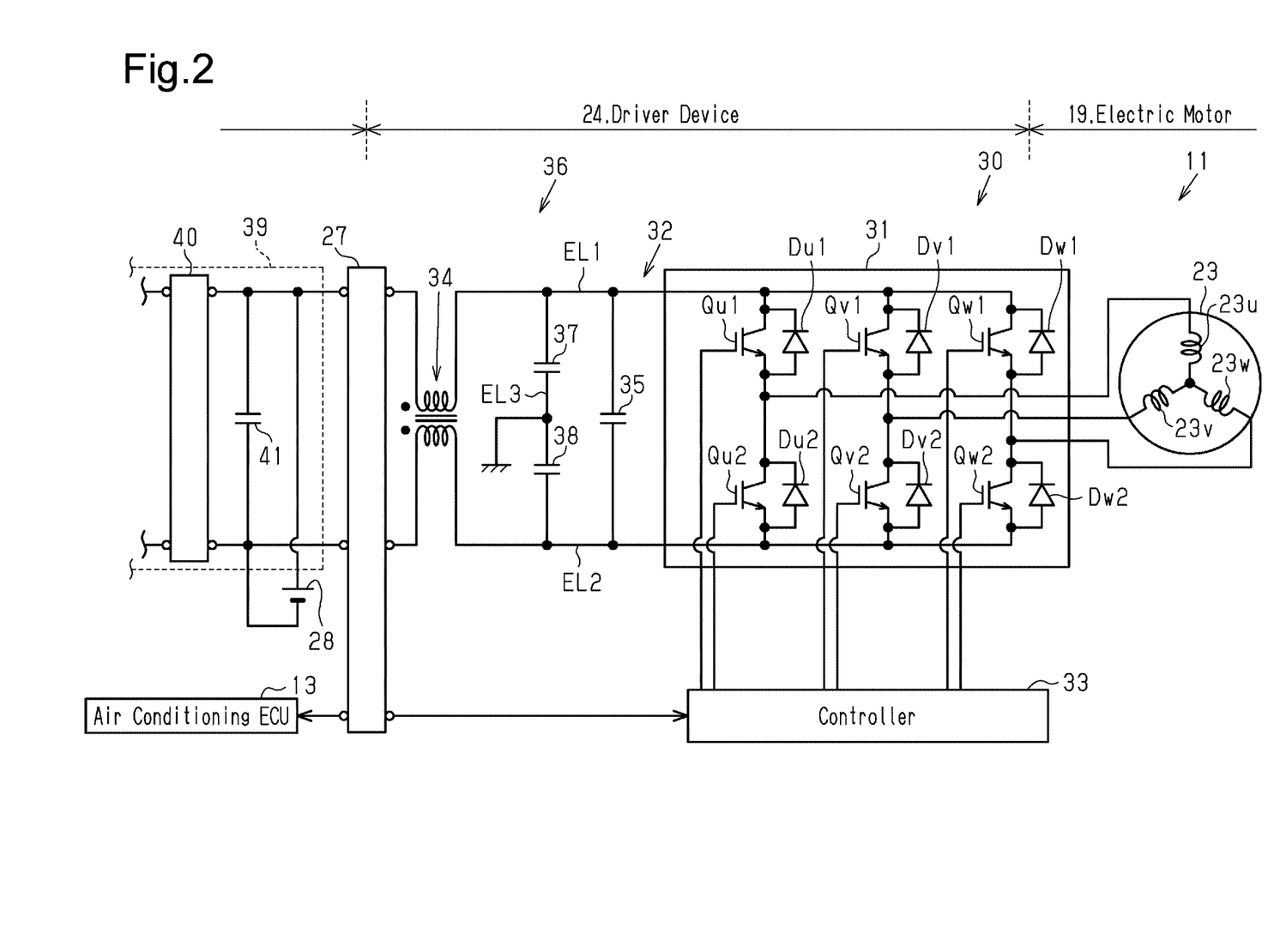
FIG. 2 is a circuit diagram showing a driver device and an electric motor.

As shown in FIG. 2, the coils 23 of the electric motor 19 are of a three-phase structure with, for example, a u-phase coil 23u, a v-phase coil 23v, and a w-phase coil 23w. The coils 23u to 23w are connected in a Y-connection.

The inverter circuit 31 includes u-phase switching elements Qu1 and Qu2 corresponding to the u-phase coil 23u, v-phase switching elements Qv1 and Qv2 corresponding to the v-phase coil 23v, and w-phase switching elements Qw1 and Qw2 corresponding to the w-phase coil 23w. Each of the switching elements Qu1 to Qw2 is, for example, a power switching element such as an insulated gate bipolar transistor (IGBT). The switching elements Qu1 to Qw2 are respectively connected to flyback diodes Du1 to Dw2 (body diodes).

The u-phase switching elements Qu1 and Qu2 are connected in series by a connection wire that is connected to the u-phase coil 23u. The serial connector formed by the u-phase switching elements Qu1 and Qu2 is electrically connected to the two connection lines EL1 and EL2 and receives direct-current power from the on-vehicle power storage device 28.

Although the corresponding coils are different, the remaining power switching elements Qv1, Qv2, Qw1, and Qw2 are connected in the same manner as the u-phase power switching elements Qu1 and Qu2.

The driver device 24 includes a controller 33 that controls the switching operation of the switching elements Qu1 to Qw2. The controller 33 is implemented by, for example, at least one dedicated hardware circuit and/or at least one processor (control circuit) that operates in accordance with computer programs (software). The processor includes a CPU and memories such as a RAM and a ROM. The memories store, for example, program codes or commands configured to cause the processor to execute various processes. The memory, or computer readable storage medium, includes any type of storage medium that is accessible by general-purpose computers and dedicated computers.

The controller 33 is electrically connected to the air conditioning ECU 13 by the connector 27. Based on the commands from the air conditioning ECU 13, the controller 33 cyclically turns the switching elements Qu1 to Qw2 on and off. In detail, the controller 33 performs a pulse width modulation control (PWM control) on the switching elements Qu1 to Qw2 based on the commands from the air conditioning ECU 13. In more detail, the controller 33 uses a carrier signal and a commanded voltage value signal (signal for comparison) to generate a control signal. The controller 33 uses the generated control signal to perform an on-off control on the switching elements Qu1 to Qw2, thereby converting the direct-current power into alternating-current power.

The noise reducer 32 includes a common-mode choke coil 34 and an X capacitor 35. The common-mode choke coil 34 and the X capacitor 35, which serves as a smoothing capacitor, configure a low-pass filter circuit 36. The low-pass filter circuit 36 is located on the connection lines EL1 and EL2. The low-pass filter circuit 36 is located between the connector 27 and the inverter circuit 31 in the circuitry.

The common-mode choke coil 34 is located on the connection lines EL1 and EL2.

The X capacitor 35 is located on the downstream side of the common-mode choke coil 34 (i.e., located closer to the inverter circuit 31). That is, the X capacitor 35 is located between the common-mode choke coil 34 and the inverter circuit 31. The X capacitor 35 is electrically connected to the connection lines EL1 and EL2. The common-mode choke coil 34 and the X capacitor 35 configure an LC resonant circuit. That is, the low-pass filter circuit 36 of the first embodiment is an LC resonant circuit including the common-mode choke coil 34.

Two Y capacitors 37 and 38, namely, a first Y capacitor 37 and a second Y capacitor 38, are connected in series. More specifically, the driver device 24 includes a bypass line EL3 that connects a first end of the first Y capacitor 37 and a first end of the second Y capacitor 38 to each other. The bypass line EL3 is grounded to the vehicle body.

The serially-connected body of the Y capacitors 37 and 38 is provided between the common-mode choke coil 34 and the X capacitor 35 and electrically connected to the common-mode choke coil 34. A second end of the first Y capacitor 37 on the side opposite to the first end is connected to the first connection line EL1, more specifically, to a portion of the first connection line EL1 that connects the first winding of the common-mode choke coil 34 and the inverter circuit 31 to each other. A second end of the second Y capacitor 38 on the side opposite to the first end is connected to the second connection line EL2, more specifically, to a portion of the second connection line EL2 that connects the second winding of the common-mode choke coil 34 and the inverter circuit 31 to each other.

The on-vehicle devices of the vehicle include, for example, a power control unit 39 (PCU) provided separately from the driver device 24. The PCU 39 uses the direct-current power supplied from the on-vehicle power storage device 28 to drive the traveling motor installed in the vehicle. That is, in the first embodiment, the PCU 39 and the driver device 24 are connected in parallel to the on-vehicle power storage device 28, and the on-vehicle power storage device 28 is shared by the PCU 39 and the driver device 24.

The PCU 39 includes a boost converter 40 and a power supply capacitor 41. The boost converter 40 includes a boost switching element. The boost converter 40 cyclically turns the boost switching element on and off to boost the direct-current power of the on-vehicle power storage device 28. That is, the power supply capacitor 41 is connected in parallel to the on-vehicle power storage device 28. Although not illustrated, the PCU 39 includes a traveling inverter that converts the direct-current power boosted by the boost converter 40 into drive power with which the traveling motor can be driven.

In the above-described configuration, the noise generated by switching the boost switching element flows into the driver device 24 as normal-mode noise. In other words, the normal-mode noise contains a noise component corresponding to the switching frequency of the boost switching element.

The configuration of the common-mode choke coil 34 will now be described with reference to FIGS. 3A to 3C, 4A, 5, and 6A to 6D.

Figure 3A:
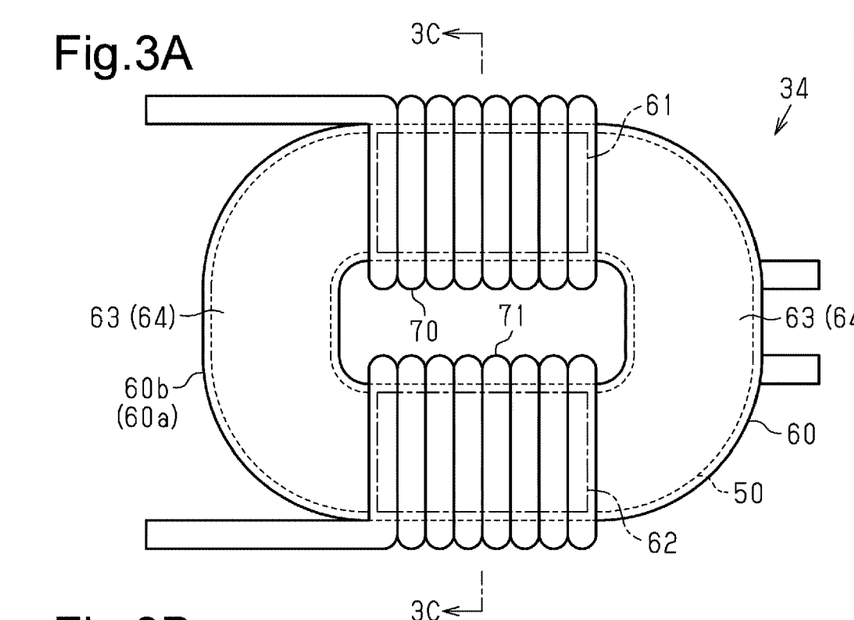
FIG. 3A is a plan view of a common-mode choke coil.
Figure 3B:
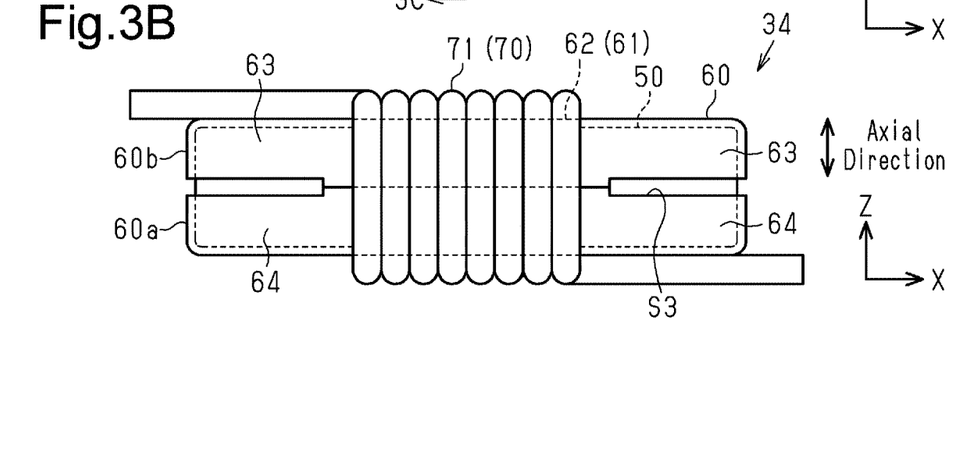
FIG. 3B is a front view of the common-mode choke coil shown in FIG. 3A.
Figure 3C:
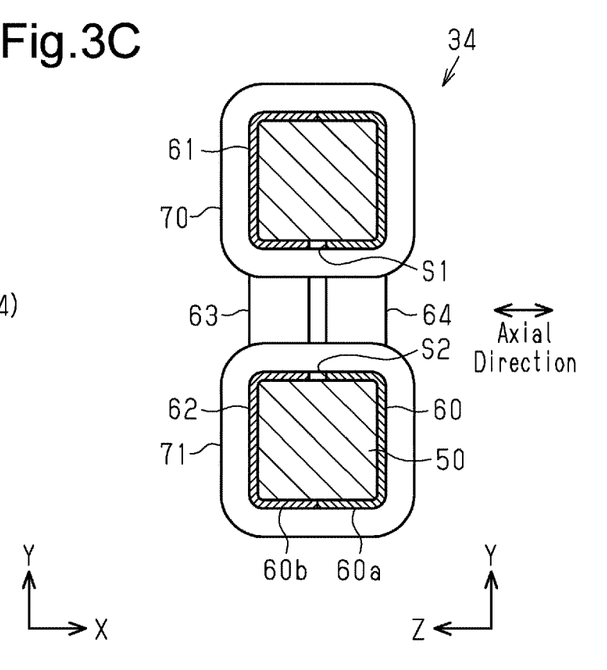
FIG. 3C is a cross-sectional view taken along line 3C-3C in FIG. 3A.

The common-mode choke coil 34 is configured to limit transmission of high-frequency noise generated in the PCU 39, which is located on the vehicle side, to the inverter circuit 31, which is located on the compressor side. In particular, the common-mode choke coil 34 is used as an L component in the low-pass filter circuit (LC filter) 36 that eliminates normal-mode noise (differential-mode noise) by utilizing the leakage inductance as a normal inductance. That is, the common-mode choke coil 34 can be used to cope with common-mode noise and normal-mode noise (differential-mode noise). Both mode noises can be coped with by a single choke coil, not by the common-mode choke coil and the normal-mode (differential-mode) choke coil respectively.

In the drawings, a three-axis orthogonal coordinate system is defined such that the axial direction of the rotating shaft 17 in FIG. 1 is referred to as the "Z direction," and the directions orthogonal to the Z direction are referred to as the "X direction" and "Y direction."

As shown in FIGS. 3A to 3C, the common-mode choke coil 34 includes a core 50, a cover 60, a first winding 70, and a second winding 71.

Figure 6A:
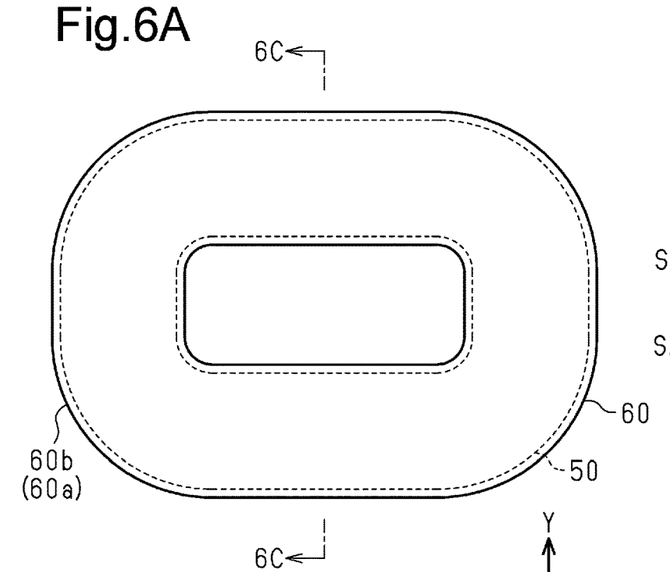
FIG. 6A is a plan view of the cover and the core.
Figure 6B:
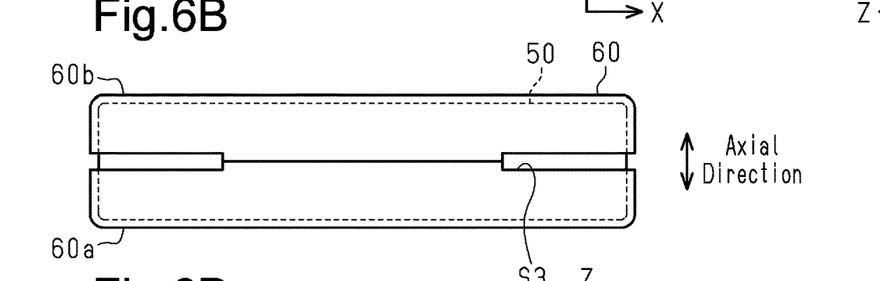
FIG. 6B is a front view of the cover and the core shown in FIG. 6A.
Figure 6C:
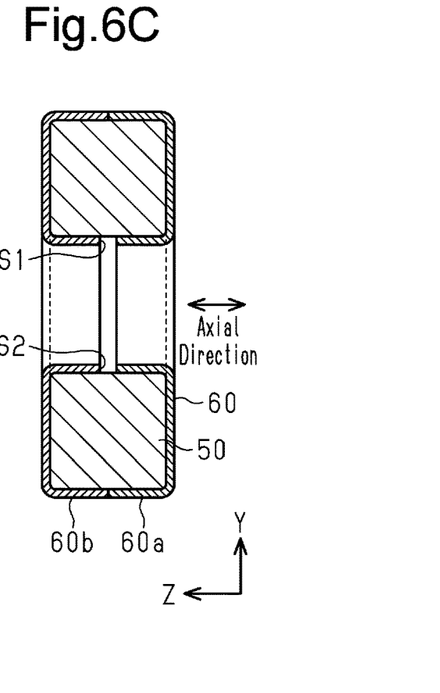
FIG. 6C is a cross-sectional view taken along line 6C-6C in FIG. 6A.
Figure 6D:
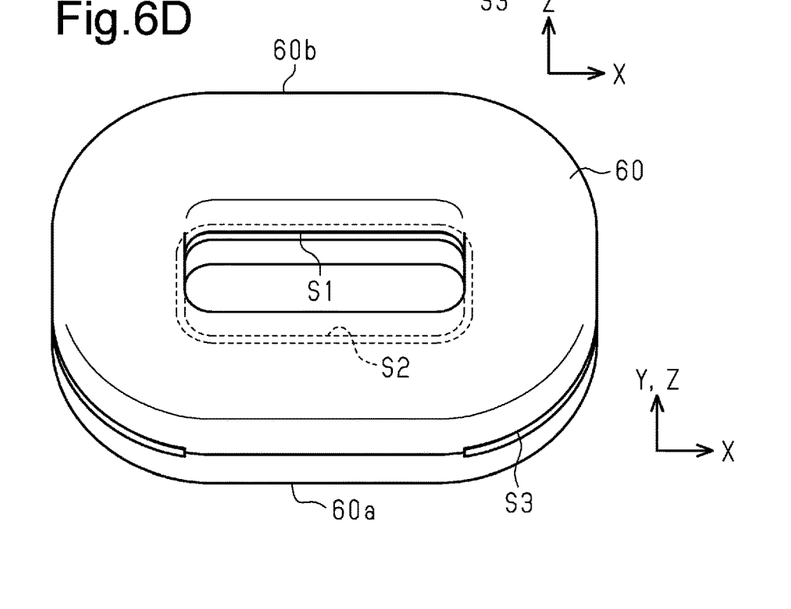
FIG. 6D is a perspective view of the cover and the core shown in FIG. 6A.

The core 50 has a substantially quadrangular cross section as shown in FIG. 3C, and entirely has a substantially rectangular shape in the X-Y plane shown in FIG. 6A.

As shown in FIGS. 5 and 6A to 6D, the cover 60 has a loop shape. The cover 60 circumferentially covers at least part of the core 50. The cover 60 is made of a conductor. For example, the cover 60 is made of a copper plate. The cover 60 includes a lower member 60a and an upper member 60b. An insulating layer (not shown) is arranged between the core 50 and the cover 60.

As shown in FIGS. 3A to 3C, the first winding 70 is wound around the outer surface of the cover 60, and the second winding 71 is wound around the outer surface of the cover 60. The winding directions of the two windings 70 and 71 are opposite to each other.

As shown in FIGS. 3A to 3C, the cover 60 includes a first region 61, a second region 62, and two connection regions 63 and 64. The first winding 70 is wound around the first region 61. The second winding 71 is wound around the second region 62. The connection region 63 is configured by the right and left upper members 60b in the X direction of the first region 61 and the second region 62. The connection region 64 is configured by the right and left lower members 60a in the X direction of the first region 61 and the second region 62. The two connection regions 63 and 64 connect the first region 61 and the second region 62 to each other in the circumferential direction of the cover 60. Further, the two connection regions 63 and 64 are arranged side by side in the axial direction of the cover 60. In such a manner, the two connection regions 63 and 64 are respectively formed on the right and left sides of the first region 61 and the second region 62 in the X direction in FIGS. 3A and 3B.

As shown in FIGS. 6A to 6D, the cover 60 has a slit (S1 and S2) that extends over the entire inner circumferential surface in the circumferential direction. The first slit S1 and the second slit S2 are connected to each other to extend continuously in the circumferential direction of the cover 60. That is, the inner circumferential surface of the cover 60 includes the first slit S1 and the second slit S2. As shown in FIG. 3C, the first slit S1 extends in the circumferential direction of the cover 60 such that the first region 61 is non-continuous with respect to the winding direction of the first winding 70. More specifically, the first region 61 is non-continuous over the entire inner circumferential surface of the cover 60 with respect to the winding direction of the first winding 70. As shown in FIG. 3C, the second slit S2 extends in the circumferential direction of the cover 60 such that the second region 62 is non-continuous with respect to the winding direction of the second winding 71. More specifically, the second region 62 is non-continuous over the entire inner circumferential surface of the cover 60 with respect to the winding direction of the second winding 71.

The first region 61 is a first straight portion extending straight, and the second region 62 is a first straight portion extending straight. The first region 61 and the second region 62 are the first straight portion and the second straight portion that extend straight entirely in parallel to each other.

Figure 4A:
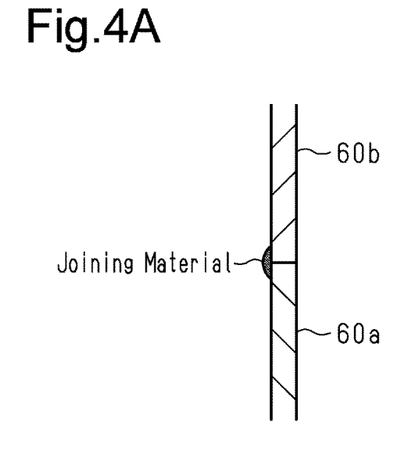
FIG. 4A is a partial cross-sectional view of a cover.

As shown in FIGS. 6A to 6D, the outer circumferential surface of the cover 60 includes a third slit S3 extending in the circumferential direction. That is, the lower member 60a and the upper member 60b are spaced apart from each other on the outer circumferential surface of the cover 60. The middle portion of the third slit S3 in the X direction is a non-continuous portion. As shown in FIG. 4A, the lower member 60a and the upper member 60b of the cover 60 are welded to each other with the end surfaces thereof in contact with each other. In this case, when current is supplied through the electrically-connected portion (welded portion) of the end surfaces, the resistance value can be reduced and stable.

The operation of the embodiment will now be described.

First, the normal mode (differential mode) will be described with reference to FIGS. 7A to 7C.

When the first winding 70 and the second winding 71 are energized, currents i1 and i2 flow. This generates magnetic fluxes and leakage magnetic fluxes φ in the core 50. An induced current i10 flows in the circumferential direction of the cover 60 inside the cover 60 so as to generate magnetic fluxes in a direction resisting the generated leakage fluxes φ. That is, when the windings 70 and 71 are energized, current flows in the cover 60 in a looped manner through the second region 62, the first connection region 63, the first region 61, the second connection region 64, and the second region 62 in this order. Regarding magnetic fluxes (not shown) generated in the core 50, the magnetic flux passing through the first winding 70 and the magnetic flux passing through the second winding 71 are oriented in opposite directions.

Figure 7A:
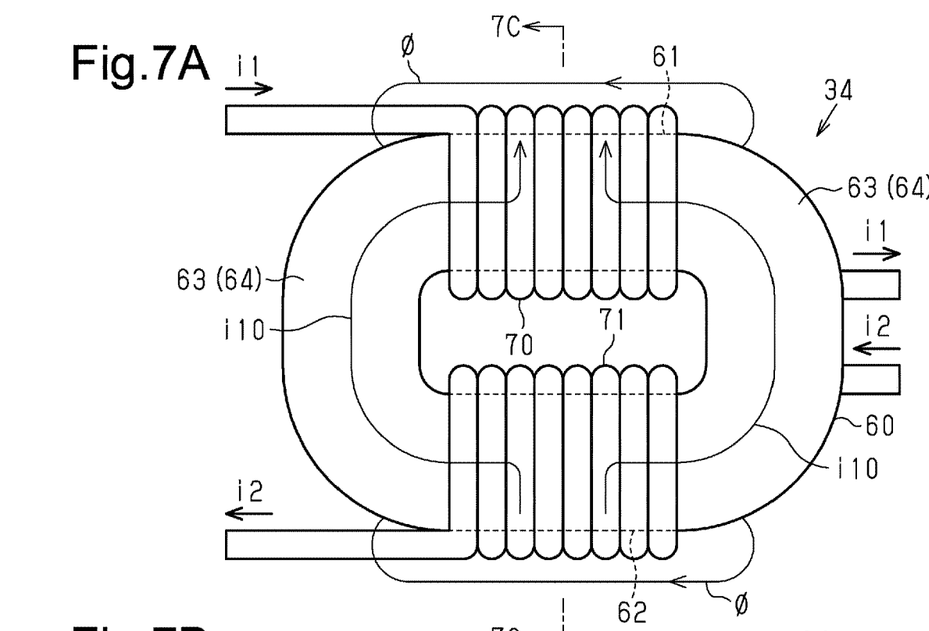
FIG. 7A is a plan view of the common-mode choke coil, illustrating an operation of the common-mode choke coil.
Figure 7B:
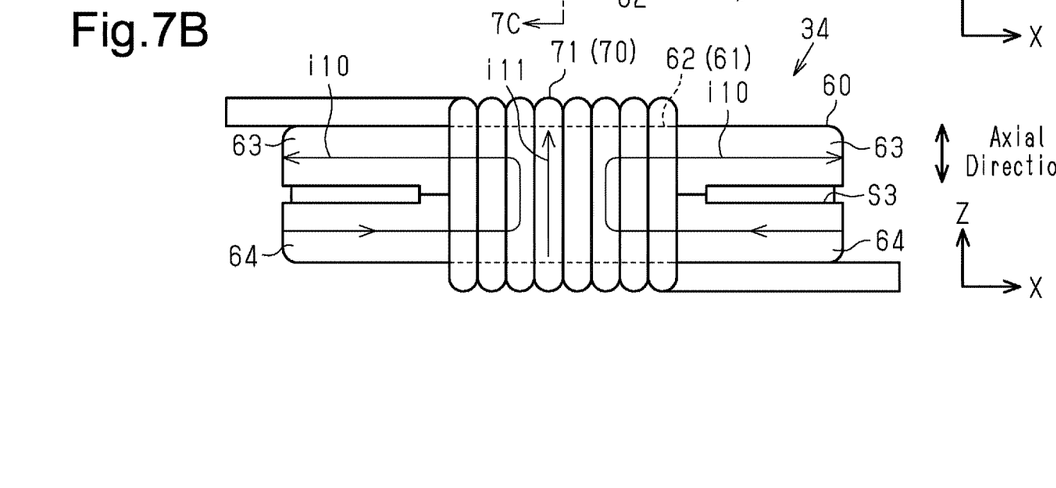
FIG. 7B is a front view of the common-mode choke coil shown in FIG. 7A.
Figure 7C:
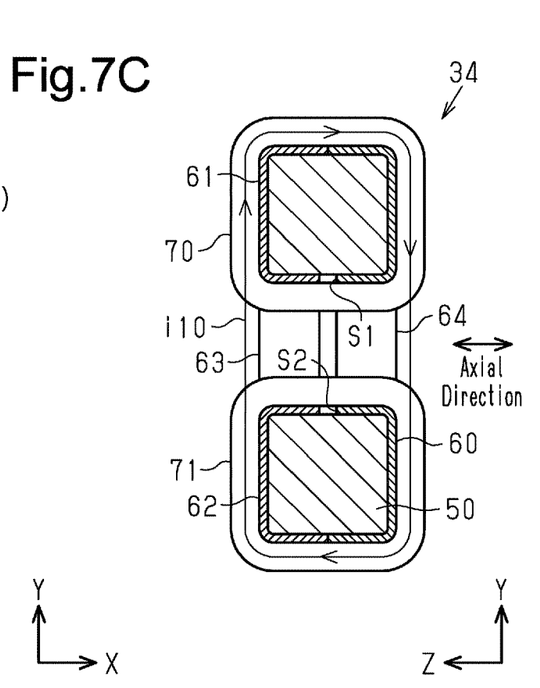
FIG. 7C is a cross-sectional view taken along line 7C-7C in FIG. 7A.

More specifically, the current i10, which is shown by the solid line in FIG. 7A, flows in the cover 60 from the first region 61 to the second region 62 through the connection region 63. Further, current flows in the same route as the current i10, which is shown by the solid line in FIG. 7A, and flows in the direction opposite to the current i10 in the connection region 64 on the surface opposite to the plane of FIG. 7A. That is, as shown in FIG. 7B, current i11 flows from the front surface of the cover 60 (upper side in FIG. 7B) to the rear surface of the cover 60 (lower side in FIG. 7B).

In this manner, the induced current (eddy current) i10 flows in the circumferential direction inside the cover 60 so as to generate magnetic fluxes in the direction resisting the leakage magnetic fluxes φ generated when the first winding 70 and the second winding 71 are energized. The induced current flowing in the circumferential direction refers to the induced current flowing around the core 50.

In the common mode, when the first winding 70 and the second winding 71 are energized, currents flow in the same direction. This generates magnetic fluxes in the same direction. In this manner, when current is supplied in the common mode, magnetic fluxes are generated and almost no leakage magnetic flux is generated in the core 50. This maintains the common impedance.

Figure 8A:
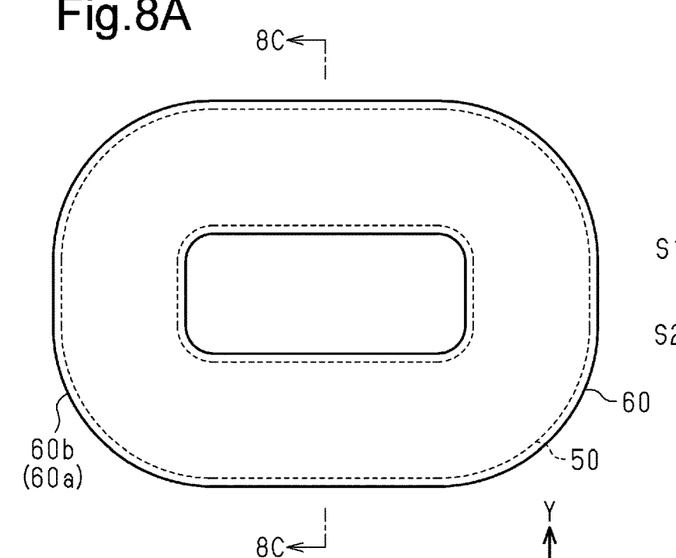
FIG. 8A is a plan view of a cover and a core in a modification.
Figure 8B:
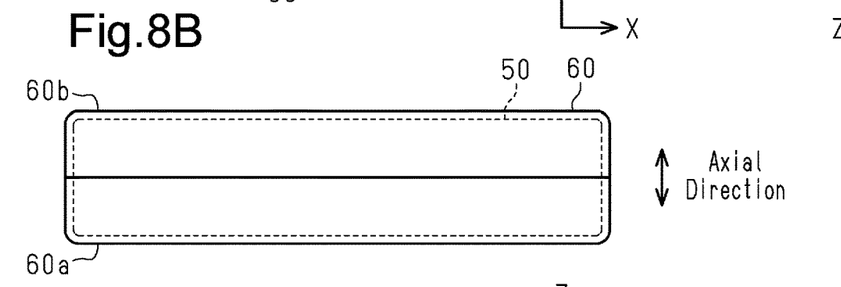
FIG. 8B is a front view of the cover and the core shown in FIG. 8A.
Figure 8C:
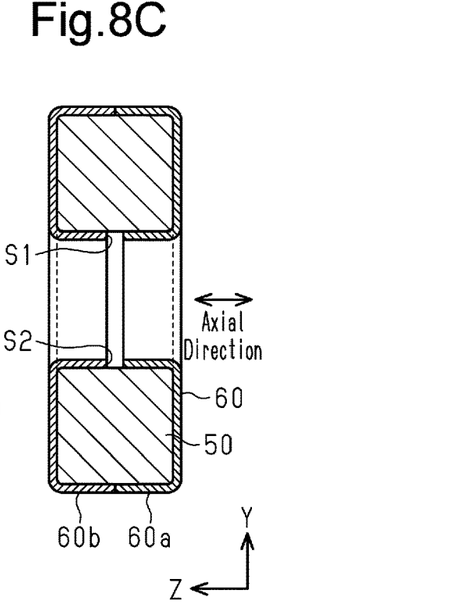
FIG. 8C is a cross-sectional view taken along line 8C-8C in FIG. 8A.
Figure 8D:
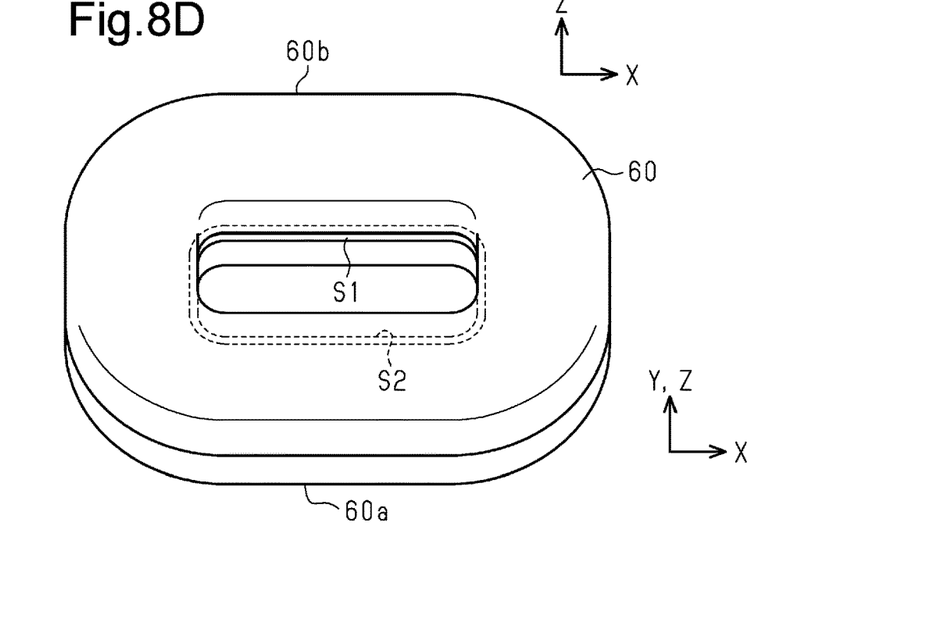
FIG. 8D is a perspective view of the cover and the core shown in FIG. 8A.
Figure 9A:
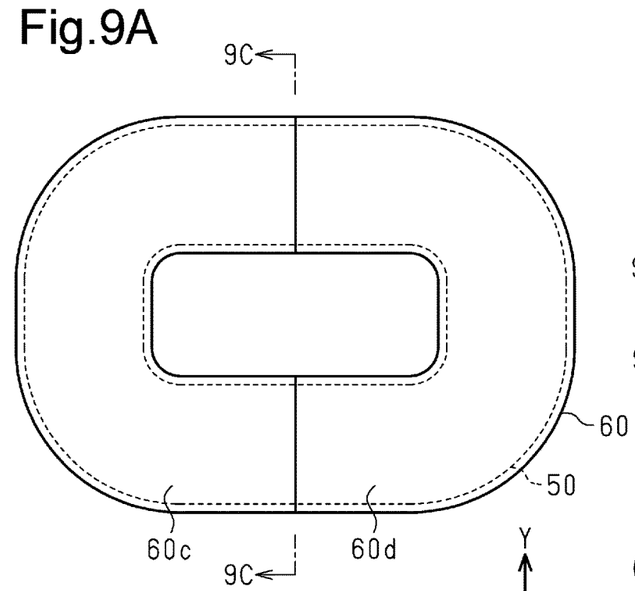
FIG. 9A is a plan view of a cover and a core in another modification.
Figure 9B:
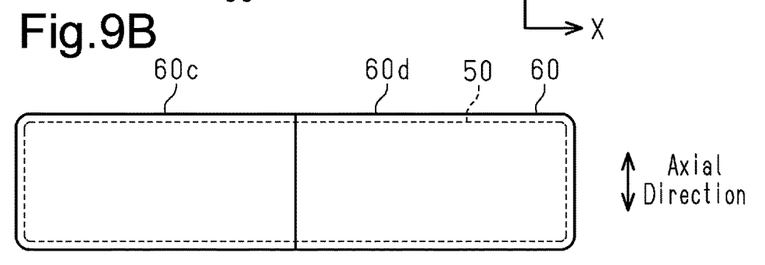
FIG. 9B is a front view of the cover and the core shown in FIG. 9A.
Figure 9C:
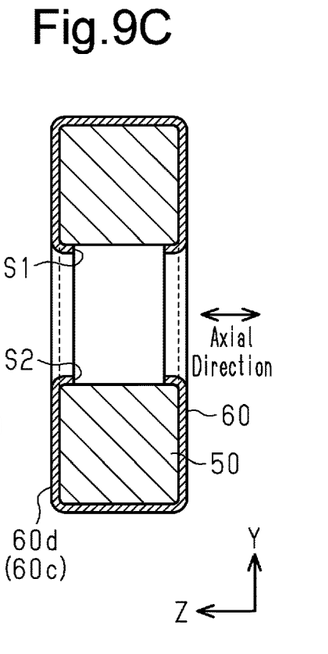
FIG. 9C is a cross-sectional view taken along line 9C-9C in FIG. 9A.
Figure 9D:
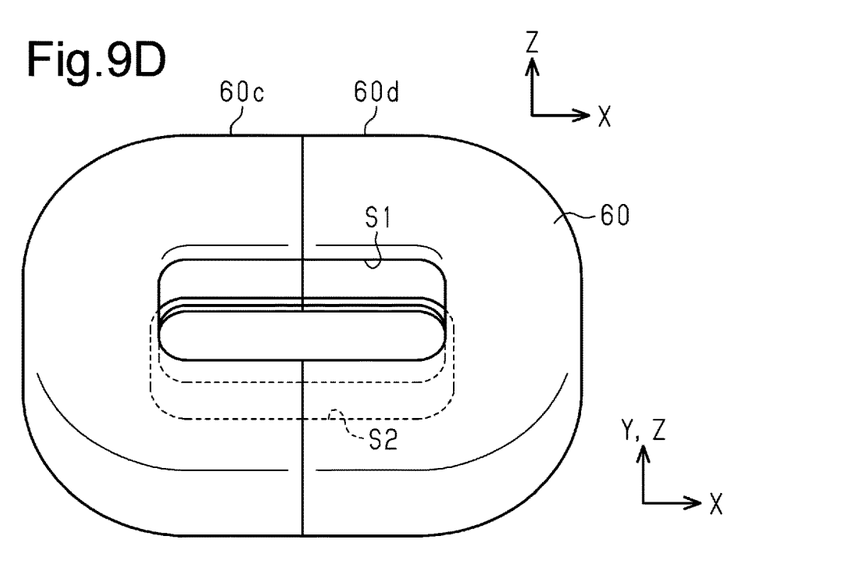
FIG. 9D is a perspective view of the cover and the core shown in FIG. 9A.
Figure 10A:
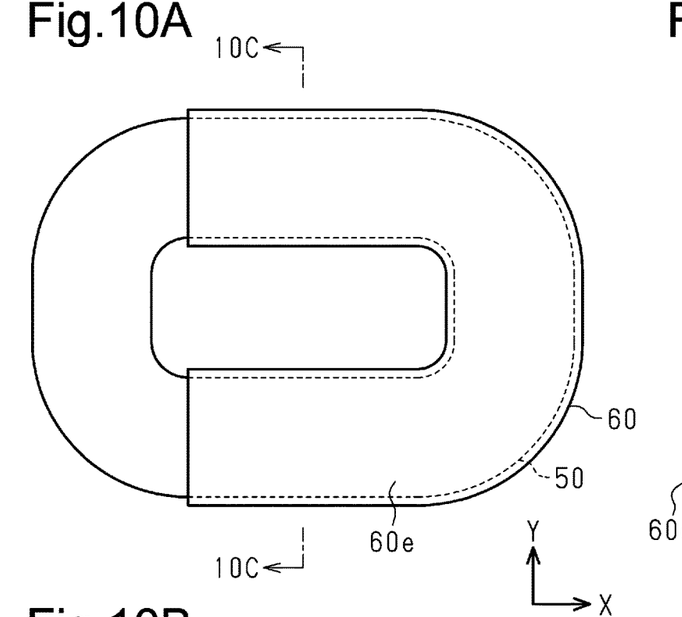
FIG. 10A is a plan view of a cover and a core in a further modification.
Figure 10B:
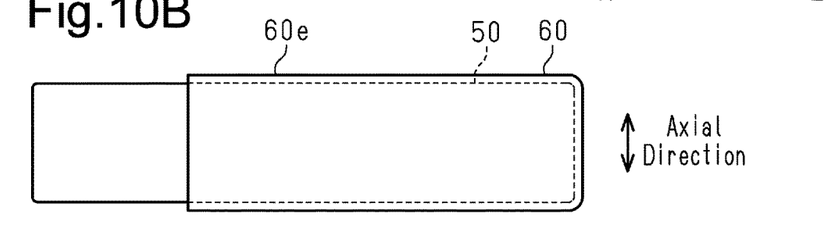
FIG. 10B is a front view of the cover and the core shown in FIG. 10A.
Figure 10C:
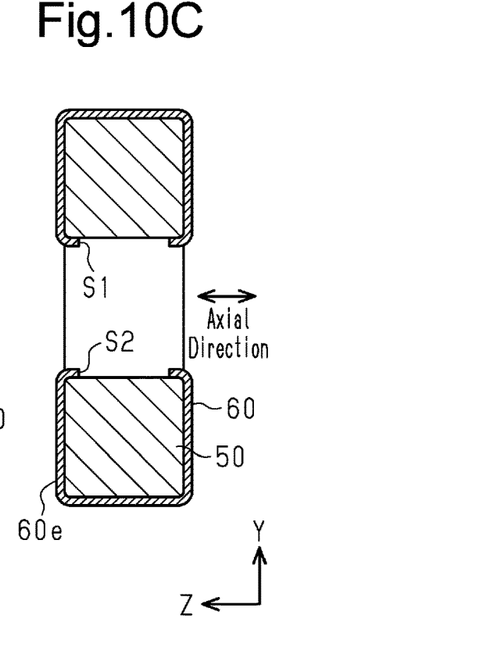
FIG. 10C is a cross-sectional view taken along line 10C-10C in FIG. 10A.
Figure 10D:
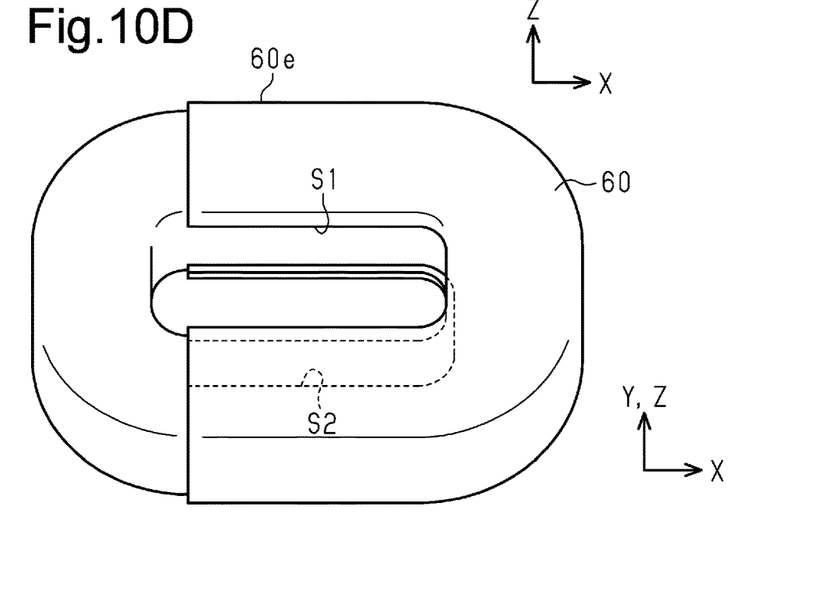
FIG. 10D is a perspective view of the cover and the core shown in FIG. 10A.
Figure 13:
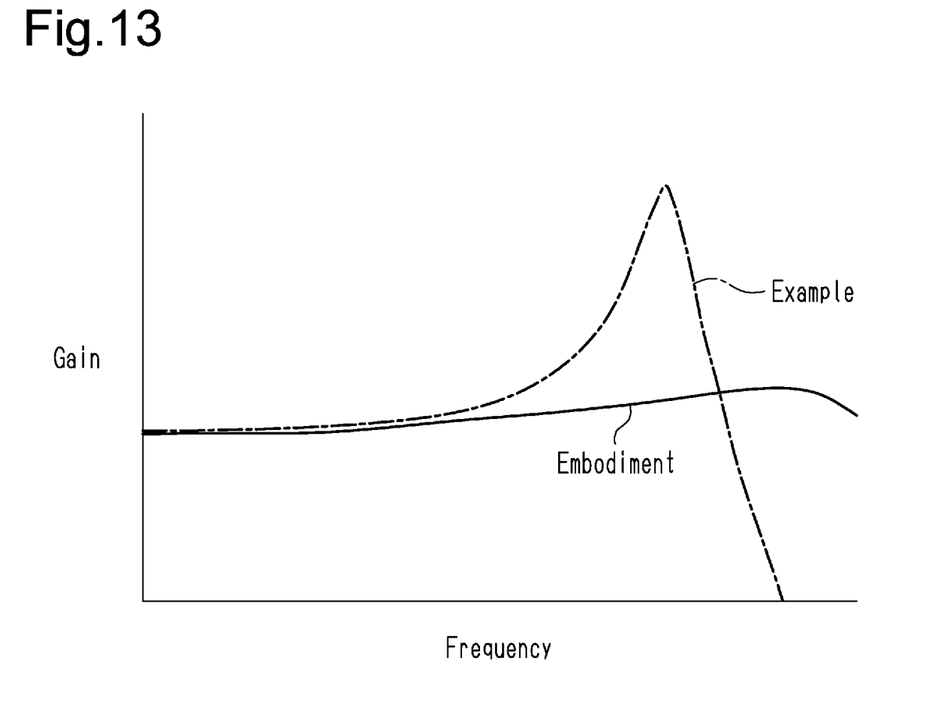
FIG. 13 is a graph showing the frequency characteristics of the gain of a low-pass filter circuit.

The frequency characteristics of the low-pass filter circuit 36 will now be described with reference to FIG. 13. FIG. 13 is a graph showing the frequency characteristics of the gain (attenuation amount) of the low-pass filter circuit 36 relative to normal-mode noise flowing into the low-pass filter circuit 36. The solid line in FIG. 13 represents the case in which the entire outer circumferential surface of the cover 60 is welded as shown in FIGS. 8A to 8C, which will be described later. The long dashed short dashed line in FIG. 13 represents the case in which the windings 70 and 71 are simply wound around the core 50. Also, in FIG. 13, the frequencies are plotted logarithmically on the horizontal axis. The gain is a type of parameter indicating an amount by which normal-mode noise can be reduced.

When the windings 70 and 71 are simply wound around the core 50, the Q factor of the low-pass filter circuit 36 (more specifically, the LC resonant circuit including the common-mode choke coil 34 and the X capacitor 35) is relatively high as indicated by the long dashed short dashed line in FIG. 13. Therefore, the normal-mode noise of a frequency close to the resonant frequency of the low-pass filter circuit 36 cannot be easily reduced.

In the cased represented by the solid line in FIG. 13, the common-mode choke coil 34 includes the cover 60 made of a conductor at a position where eddy currents are generated by the line of magnetic force (leak magnetic fluxes φ) generated in the common-mode choke coil 34. The cover 60 is located at a position through which the leakage magnetic fluxes φ extend. The cover 60 is configured such that the extension of the leakage magnetic fluxes φ through the cover 60 generates an induced current (eddy current) that generates magnetic fluxes in a direction cancelling the leakage magnetic fluxes φ. As a result, the cover 60 lowers the Q factor of the low-pass filter circuit 36. Thus, as indicated by the solid line in FIG. 13, the Q factor of the low-pass filter circuit 36 is low. Therefore, the normal-mode noise having a frequency near the resonant frequency of the low-pass filter circuit 36 is also reduced by the low-pass filter circuit 36.

As described above, the employment of a metal shielding structure with the cover 60 in the common-mode choke coil allows for the use of the low-pass filter circuit as the common-mode choke coil, thereby reducing the common mode noise. Also, the leakage magnetic fluxes generated relative to normal-mode current (differential-mode current) are fully utilized to obtain suitable filtering characteristics that involve the reduction of normal-mode noise (differential-mode noise). That is, the use of the cover 60 generates magnetic fluxes resisting the leakage magnetic fluxes generated when normal-mode current (differential-mode current) is supplied, and electromagnetic induction is performed to cause the current to flow in the cover 60 and to be consumed as heat. Since the cover 60 acts as a magnetic resistance, a damping effect is obtained and the resonance peak generated by the low-pass filter circuit is reduced (refer to FIG. 13). Further, when current is supplied in the common mode, magnetic fluxes are generated but almost no leakage magnetic flux is generated in the core. This maintains the common impedance.

The above-described embodiment has the following advantages.

(1) The on-vehicle motor-driven compressor 11 includes the inverter device 30, which drives the electric motor 19. The inverter device 30 includes the inverter circuit 31 and the noise reducer 32. The noise reducer 32 includes the common-mode choke coil 34 and the X capacitor 35, which serves as a smoothing capacitor. The common-mode choke coil 34 and the X capacitor 35 configure the low-pass filter circuit 36. The common-mode choke coil 34 includes the loop-shaped core 50, the loop-shaped cover 60, the first winding 70, and the second winding 71. The cover 60 is made of a conductor circumferentially covering at least part of the core 50. The first winding 70 is wound around the outer surface of the cover 60. The second winding 71 is wound around the outer surface of the cover 60. The cover 60 includes the first region 61, the second region 62, and the two connection regions 63 and 64. The first winding 70 is wound around the first region 61. The second winding 71 is wound around the second region 62. The two connection regions 63 and 64 connect the first region 61 and the second region 62 to each other in the circumferential direction of the cover 60 and are arranged side by side in the axial direction of the cover 60. The cover 60 has the first slit S1 extending over the entire inner circumferential surface in the circumferential direction of the cover 60 such that the first region 61 is non-continuous with respect to the winding direction of the first winding 70. The cover 60 has the second slit S2 extending over the entire inner circumferential surface in the circumferential direction of the cover 60 such that the second region 62 is non-continuous with respect to the winding direction of the second winding 71.

Thus, the induced current i10 can be supplied so as to generate magnetic fluxes in the direction resisting the leakage magnetic fluxes φ that are generated when the first winding 70 and the second winding 71 are energized. Accordingly, when heat is generated, a damping effect can be obtained. This provides the on-vehicle motor-driven compressor including the filter circuit excellent in the damping effect.

(2) The first region 61 is the first straight portion extending straight, and the second region 62 is the second straight portion extending straight. The first region 61 and the second region 62 respectively include the first straight portion and the second straight portion, which extend straight in parallel to each other. Thus, the cover 60 can be easily arranged. This is of practical use.

(3) Welding is performed on the outer circumferential surface of the cover 60 only partially, not entirely. This facilitates the manufacturing of the cover 60. Further, the induced current flows on the outer circumferential surface of the cover 60 only partially, not entirely. This limits the generation of heat.

It should be apparent to those skilled in the art that the present disclosure may be embodied in many other specific forms without departing from the spirit or scope of the disclosure. Particularly, it should be understood that the present disclosure may be embodied in the following forms.

The cover 60 does not have to be made of copper. Instead, the cover 60 may be made of, for example, aluminum, brass, or stainless steel. Further, the material is not limited to a non-magnetic metal such as copper but may be a magnetic metal. However, when a magnetic metal such as iron is used for the cover 60, the flow of an induced current generates further magnetic fluxes. Since this may adversely affect the cover 60, it is preferred that a non-magnetic metal be used.

Figure 4B:
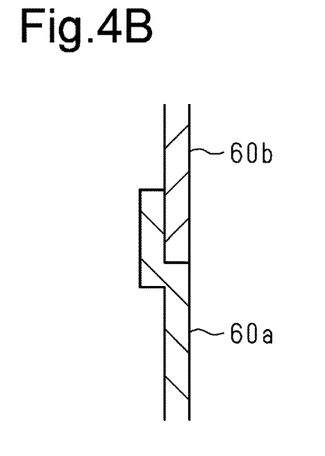
FIG. 4B is a partial cross-sectional view of the cover.
Figure 5:
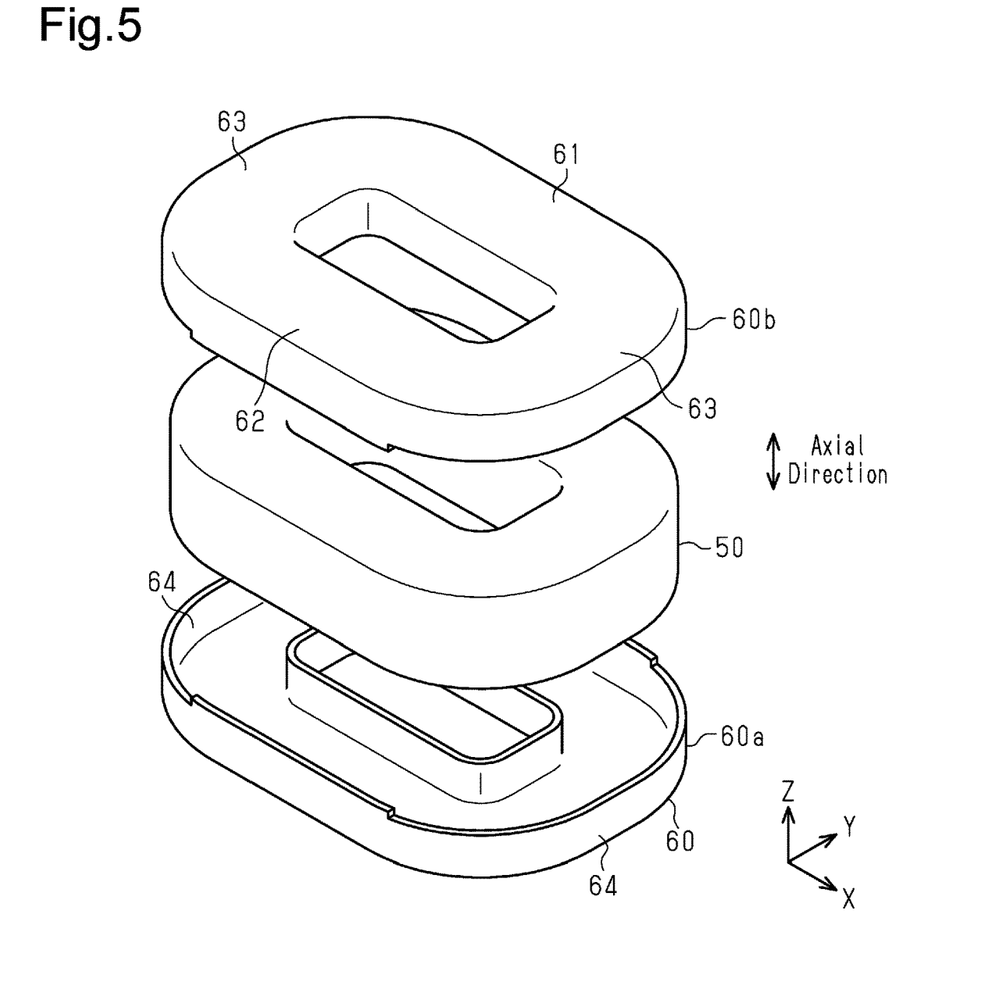
FIG. 5 is an exploded perspective view showing the cover and a core.

As shown in FIG. 4A, the lower member 60a and the upper member 60b of the cover 60 are welded to each other with the end surfaces thereof in contact with each other. Instead, as shown in FIG. 4B, the lower member 60a and the upper member 60b of the cover 60 may be fixed to each other (contact each other) by overlapping part of the distal end of the lower member 60a and part of the distal end of the upper member 60b with each other. This case does not involve welding and thus allows the cover 60 to be easily manufactured. Welding may be performed after overlapping part of the distal end of the lower member 60a and part of the distal end of the upper member 60b of the cover with each other.

Instead of the structure of the cover illustrated in FIGS. 6A to 6D, the structure illustrated in FIGS. 8A to 8D may be employed. In FIGS. 8A to 8D, the lower member 60a and the upper member 60b may be in contact with each other on the entire outer circumferential surface of the cover.

Instead of the structure of the cover illustrated in FIGS. 6A to 6D, the structure illustrated in FIGS. 9A to 9D may be employed. In FIGS. 9A to 9D, two U-shaped covers 60c and 60d serving as cover components may be fitted (inserted) from the opposite sides of the core 50 (opposite sides in the X direction).

As a modification of the structure illustrated in FIGS. 9A to 9D, the structure illustrated in FIGS. 10A to 10D may be employed. In FIGS. 10A to 10D, a U-shaped cover 60e serving as a cover component, i.e., a cover 60e having the shape of a substantially semi-circular loop or an incomplete loop, may be fitted (inserted) from one side of the core 50.

Figure 11:
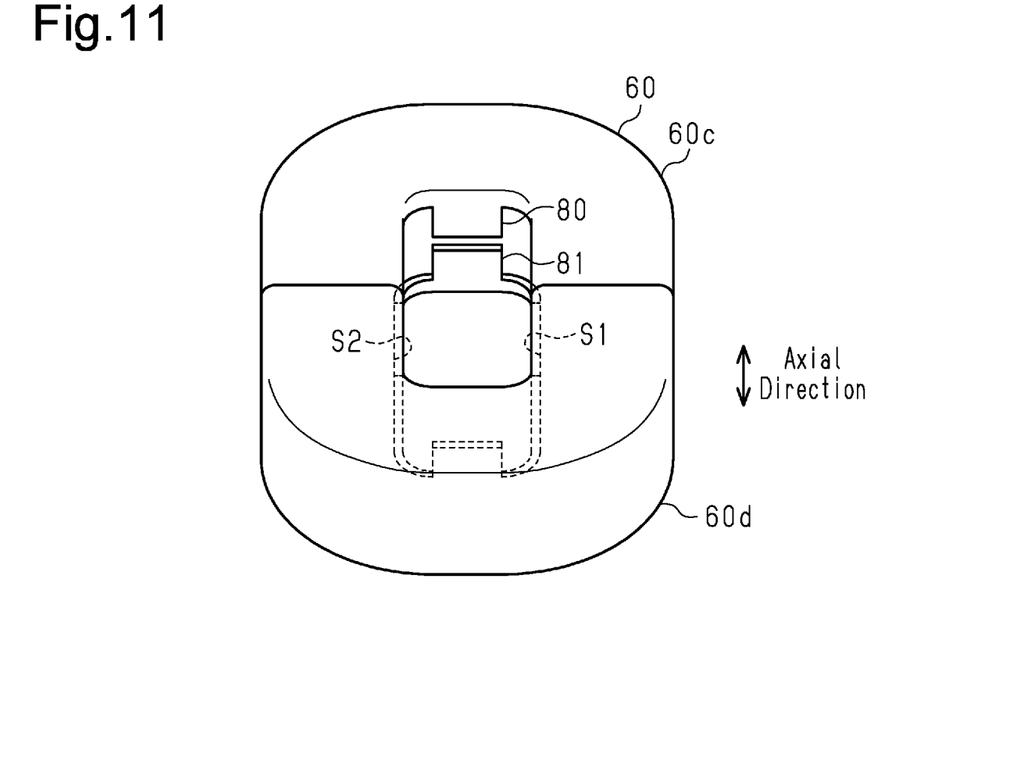
FIG. 11 is a perspective view of a cover and a core in yet another modification.

As a modification of the structure illustrated in FIGS. 9A to 9D, as shown in FIG. 11, the shape of the slit on the inner circumferential surface of the cover 60 may be shaped such that parts of the slit are arranged proximate to each other at portions of the short sides of the slit. That is, after the U-shaped covers 60c and 60d are fitted, projections 80 and 81 of the inner circumferential surface may be bent toward each other in the axial direction.

Figure 12:
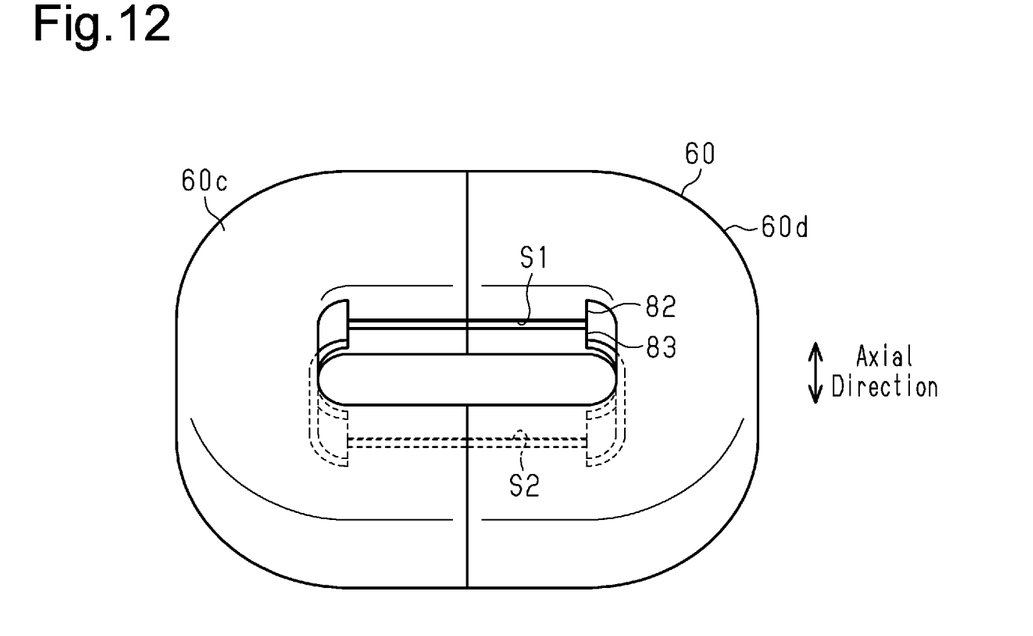
FIG. 12 is a perspective view of a cover and a core in still another modification.

As another modification of the structure illustrated in FIGS. 9A to 9D, as shown in FIG. 12, the shape of the slit on the inner circumferential surface of the cover 60 may be shaped such that parts of the slit are arranged proximate to each other at portions of the long sides of the slit. That is, after the U-shaped covers 60c and 60d are fitted, projections 82 and 83 of the inner circumferential surface may be bent toward each other in the axial direction.

Therefore, the present examples and embodiments are to be considered as illustrative and not restrictive and the disclosure is not to be limited to the examples and embodiments given herein.

The invention claimed is:

1. An on-vehicle motor-driven compressor comprising:
   a compression unit configured to compress fluid;
   an electric motor configured to drive the compression unit; and
   an inverter device configured to drive the electric motor, wherein
   the inverter device includes
      an inverter circuit configured to convert direct-current power into alternating-current power, and
      a noise reducer arranged on an input side of the inverter circuit, wherein the noise reducer is configured to reduce common-mode noise and normal-mode noise contained in the direct-current power before being input to the inverter circuit,
   the noise reducer includes
      a common-mode choke coil, and
      a smoothing capacitor, wherein the common-mode choke coil and the smoothing capacitor configure a low-pass filter circuit,
   the common-mode choke coil includes
      a loop-shaped core,
      a cover made of a conductor circumferentially covering at least part of the core, the cover having a shape of a loop or an incomplete loop,
      a first winding wound around an outer surface of the cover, and
      a second winding wound around the outer surface of the cover,
   the cover includes
      a first region around which the first winding is wound,
      a second region around which the second winding is wound, and
      two connection regions that connect the first region and the second region to each other in a circumferential direction of the cover, wherein the two connection regions are arranged side by side in an axial direction of the cover,
   the cover has a first slit in an inner circumferential surface, the first slit extending in the circumferential direction of the cover such that the first region is non-continuous with respect to a winding direction of the first winding,
   the cover has a second slit in the inner circumferential surface, the second slit extending in the circumferential direction of the cover such that the second region is non-continuous with respect to a winding direction of the second winding,
   the cover has a third slit in an out circumferential surface, the third slit extending in the circumferential direction of the cover, and
   the two connection regions are arranged side by side in the axial direction of the cover such that the third slit is located between the two connection regions.

2. The on-vehicle motor-driven compressor according to claim 1, wherein
   the first region includes a first straight portion,
   the second region includes a second straight portion, and
   the first straight portion and the second straight portion extend straight in parallel to each other.

3. The on-vehicle motor-driven compressor according to claim 1, wherein
   the first region is non-continuous over the entire inner circumferential surface of the cover with respect to the winding direction of the first winding, and
   the second region is non-continuous over the entire inner circumferential surface of the cover with respect to the winding direction of the second winding.

4. The on-vehicle motor-driven compressor according to claim 1, wherein
   the first slit and the second slit continuously extend in the circumferential direction of the cover, and
   a slit configured by the first slit and the second slit extends over the entire inner circumferential surface of the cover.

* * * * *